US012753489B2

(12) United States Patent
Heiland et al.

(10) Patent No.: US 12,753,489 B2
(45) Date of Patent: Oct. 6, 2026

(54) COATING MODULE WITH IMPROVED CATHODE ARRANGEMENT

(71) Applicant: SINGULUS TECHNOLOGIES AG, Kahl am Main (DE)

(72) Inventors: Ralf Heiland, Wiesbaden (DE); Andreas Ruppel, Butzbach (DE); Stefan Kempf, Alzenau (DE)

(73) Assignee: SINGULUS TECHNOLOGIES AG, Kahl am Main (DE)

( * ) Notice: Subject to any disclaimer, the term of this patent is extended or adjusted under 35 U.S.C. 154(b) by 0 days.

(21) Appl. No.: 18/846,614

(22) PCT Filed: Feb. 9, 2023

(86) PCT No.: PCT/EP2023/053197

§ 371 (c)(1),
(2) Date: Sep. 12, 2024

(87) PCT Pub. No.: WO2023/174620

PCT Pub. Date: Sep. 21, 2023

(65) Prior Publication Data

US 2025/0207238 A1 Jun. 26, 2025

(30) Foreign Application Priority Data

Mar. 17, 2022 (DE) ..................... 10 2022 000 936.6

(51) Int. Cl.
*C23C 14/34* (2006.01)
*C23C 14/56* (2006.01)

(52) U.S. Cl.
CPC .......... *C23C 14/3407* (2013.01); *C23C 14/56* (2013.01)

(58) Field of Classification Search
CPC .. C23C 14/3407; C23C 14/56; H01J 37/3288; H01J 37/3435; H01J 37/3441; H01J 37/345
See application file for complete search history.

(56) References Cited

U.S. PATENT DOCUMENTS

| | | | | | |
|---|---|---|---|---|---|
| 5,487,822 | A * | 1/1996 | Demaray | ............ | H01J 37/3435 204/298.12 |
| 5,518,593 | A * | 5/1996 | Hosokawa | ........ | H01J 37/32458 118/724 |
| 5,531,876 | A | 7/1996 | Saunders et al. | | |
| 7,520,969 | B2 * | 4/2009 | Miller | ............... | H01L 21/68735 118/728 |
| 10,435,783 | B2 | 10/2019 | Nakamura et al. | | |
| 2007/0045108 | A1 * | 3/2007 | Demaray | ............ | H01J 37/3435 204/298.12 |
| 2010/0101602 | A1 * | 4/2010 | Deehan | ................. | B08B 7/0035 134/1.1 |

(Continued)

OTHER PUBLICATIONS

International Preliminary Report on Patentability for PCT Application No. PCT/EP2023/053197 mailed Sep. 10, 2024 (Original and translation).

(Continued)

*Primary Examiner* — Patrick S Ott
(74) *Attorney, Agent, or Firm* — Branch Partners PLLC; Bruce E. Black

(57) ABSTRACT

The present invention relates to a coating module for a coating system as well as to a method for replacing a coating target in a coating module.

25 Claims, 5 Drawing Sheets

(56) References Cited

U.S. PATENT DOCUMENTS

| | | | | |
|---|---|---|---|---|
| 2015/0262798 | A1* | 9/2015 | Binns | H01J 37/3414 204/298.03 |
| 2016/0172168 | A1 | 6/2016 | Miller et al. | |
| 2018/0337052 | A1 | 11/2018 | Ramalingam et al. | |
| 2020/0090915 | A1* | 3/2020 | Kerschbaumer | H01J 37/3414 |
| 2021/0124253 | A1* | 4/2021 | Yoong | G03F 7/16 |

OTHER PUBLICATIONS

International Search Report and Written Opinion for PCT Application No. PCT/EP2023/053197 mailed May 19, 2023 (Original and translation).

* cited by examiner

COATING MODULE WITH IMPROVED CATHODE ARRANGEMENT

CROSS-REFERENCE TO RELATED APPLICATIONS

This present application is a U.S. national stage application of PCT Application No. PCT/EP2023/053197, filed Feb. 9, 2023, which claims priority to German Patent Application No. 10 2022 000 936.6, filed Mar. 17, 2022, both of which are hereby incorporated by reference in their entirety.

The present invention is directed to a coating module for a coating system, to a coating system with such a coating module, as well as to a method for replacing a coating target in such a coating module.

A wide variety of coating modules are used in coating systems, as described, e.g., in US 2016/0172168 A1 and DE 44 14 470 A1. Coating modules that utilize the process of, e.g., physical vapor deposition generally use a coating unit consisting of a coating target, a target backplate for mounting the coating target, a so-called dark space shield, and a magnet system. This coating unit is mounted in a process chamber which can be evacuated and must be able to be opened for maintenance purposes. A chamber lid is usually provided for this purpose, on or in which the complete coating unit is mounted. If a used coating target needs to be replaced in such a coating module, the chamber lid can be opened together with the coating unit (for instance, just above the vertical or by 180°) to gain access to the coating unit. After the coating target has been replaced, the target backplate with target and dark space must then be mounted one after the other and aligned with the coating module. This is difficult and time-consuming due to the sometimes heavy weight of the individual components.

It is thus an object of the present invention to provide a coating module which has been improved in this respect, a coating system with such a coating module, and a method for replacing a coating target in such a coating module. This object is solved by the independent claims. Preferred embodiments of the present invention are described, inter alia, in the dependent claims.

In accordance with a first aspect, the present invention is, inter alia, directed to a coating module for a coating system, wherein the coating module comprises a process chamber which can be evacuated, a chamber lid with which the process chamber may be sealed in a vacuum-tight manner, and a coating unit consisting of a coating target, a target backplate, a dark space shield, and a magnet system. The coating target, the target backplate and the dark space shield are mounted in the process chamber. The magnet system is mounted on the chamber lid, and a media supply is provided for providing the coating unit with a fluid and/or energy on the target side.

Oftentimes, the dark space shield is referred to as a "shield" and serves as an anode to the cathode counterpart, consisting of the target backplate and coating target.

In this context, the coating target, the target backplate and the dark space shield are preferably not connected to the chamber lid, thus separating the magnet system from the rest of the coating unit when lifting the chamber lid from the process chamber. Accordingly, a group consisting of the target backplate, the coating target, and the dark space remains in the operative position after opening the chamber lid. This allows for the heavy cathode (consisting of coating target and target backplate) to be replaced in a good ergonomic position. Furthermore, the contour of the cathode no longer has to fit into a geometry in the process chamber so that the parting plane can be designed as a flat plane. Due to the overall reduced weight of the chamber lid, the lid can be opened manually, e.g., by means of gas pressure springs for support, and an electric drive is no longer required. Furthermore, the separation of the magnet system and the rest of the coating unit according to the invention allow the media supply or the corresponding media connections to be laid statically.

Accordingly, it is preferred, among other things, that the media supply is not connected to the chamber lid so that the media supply remains static while the chamber lid is lifted from the process chamber.

In accordance with another aspect, the present invention is further directed to a coating module for a coating system, wherein the coating module comprises a process chamber which can be evacuated, a chamber lid by means of which the process chamber may be sealed in a vacuum-tight manner, and a coating unit consisting of a coating target, a target backplate, a dark space shield, and a magnet system. The coating target, the target backplate and the dark space shield are mounted in the process chamber, wherein the magnet system is mounted on the chamber lid. In this context, the coating target, the target backplate and the dark space shield are not connected to the chamber lid, thus separating the magnet system from the rest of the coating unit when lifting the chamber lid from the process chamber.

The preferred features described below may be applied to both aspects according to the invention.

Preferably, the coating target, the target backplate and the dark space shield form a pre-assembled group which can be mounted as a unit in the process chamber and removed from it. In order to facilitate the mounting, a spring member is also preferably provided, by means of which the group of coating target, target backplate and dark space shield is positioned in a defined manner in the process chamber. Preferably, the spring member is used to center the group along at least one axis, preferably along several axes. Furthermore, the group can be contacted electrically by means of the spring member. Preferably, the dark space shield is connected, particularly preferably screwed, to the coating target and/or the target backplate in an insulated manner.

Preferably, the chamber lid and the magnet system form a flat separation plane which can engage with a corresponding flat separation plane of the process chamber in a vacuum-tight manner. In particular, the contour of the cathode no longer has to fit into a corresponding geometry in the process chamber.

Preferably, the inner side of the chamber lid has a concave curvature, wherein the concave curvature is preferably designed in relation to the thickness of the chamber lid or its underside, and the vacuum provided during operation is designed in such a way that the inner side of the chamber lid is configured in a flat manner under vacuum. In other words, the geometry of the concave curvature is defined in such a way that a uniform dark space clearance is ensured under process conditions. In this context, the concave curvature may comprise sections circular-cylindrical or spherical in shape or be curved in a completely circular-cylindrical or spherical manner.

Preferably, the target backplate comprises one or more protrusions, with connections for the fluid and/or the energy being provided on the protrusions. Accordingly, the media supply takes place statically from the target side, wherein the media connections are screwed together with the insulating counterpart in the process chamber by means of screws or similar connection elements in order to achieve a defined, vacuum-tight connection. Preferably, further connections do not have to be disconnected or reconnected in order to mount or remove the cathode.

As already mentioned, the chamber lid can be swung open preferably manually, preferably with support of a gas spring.

The present invention is further directed to a coating system with a coating module as described above as well as several further modules, wherein the modules are arranged substantially annularly and wherein the chamber lid of the coating module can be swung open in the direction of the inner side of the ring. As a result, the open chamber lid does not interfere with, e.g., service work and does not collide with other process modules during the swinging movement. The ring may be a ring in the shape of a circle or an ellipse. However, the ring may also have a polygonal shape, e.g., rectangular or square.

As already explained, the arrangement according to the invention enables ergonomic working under conditions that improve occupational safety. The flat parting plane enables a static supply of the media from the target side, which leads to considerable simplification or improvement of the media supply.

The present invention further relates to a method for replacing a coating target in a coating module, which comprises a process chamber which can be evacuated, a chamber lid with which the process chamber may be sealed in a vacuum-tight manner, and a coating unit consisting of a coating target, a target backplate, a dark space shield, and a magnet system. Preferably, the coating module is a coating module as described above, thus allowing for all preferred features of the coating module according to the invention to come into operation also in the context of the method according to the invention.

In accordance with the method according to the invention, the coating module or its evacuatable process chamber is first vented and, subsequently, the chamber lid is opened. In the state with the chamber lid open, the coating target, the target backplate and the dark space shield are then removed and a new coating target, a new target backplate and a new dark space shield are mounted afterwards. After successful mounting and any necessary alignment, the chamber lid is closed again and the coating module or its evacuatable process chamber is pumped down.

As already explained in the context of the coating module according to the invention, the coating target, the target backplate and the dark space shield preferably form a pre-assembled group which can be mounted as a unit in the process chamber and removed from it. Accordingly, the step of removing the coating target, the target backplate and the dark space shield preferably comprises the removal of said pre-assembled unit. In an analogous manner, the step of mounting a new coating target, a new target backplate and a new dark space shield preferably comprises the mounting of a pre-assembled group of a new coating target, a new target backplate and a new dark space shield. In this way, the replacement of the corresponding components may take place particularly efficiently and quickly, which may significantly reduce the maintenance time of the corresponding coating module.

Depending on the strength of the material used, the thickness of the chamber lid or its underside is preferably designed in such a way that the inner side of the chamber lid forms a flat surface after the coating module has been pumped down. In the context of the present invention, a flat surface is understood to be a surface whose height profile varies by a maximum of 0.2 mm, more preferably by a maximum of 0.1 mm.

After the coating module has been pumped down, the coating target is preferably mounted in the process chamber free of vacuum forces. In other words, the coating target is preferably mounted in the coating module in such a way that no forces generated by the vacuum act on the coating target.

Preferably, the coating target and the target backplate are located in the vacuum all around after the coating module has been pumped down, with the exception of the local connection points for the media supply.

In the following, preferred embodiments of the present invention are described in more detail with reference to the figures, wherein.

Figure 1:
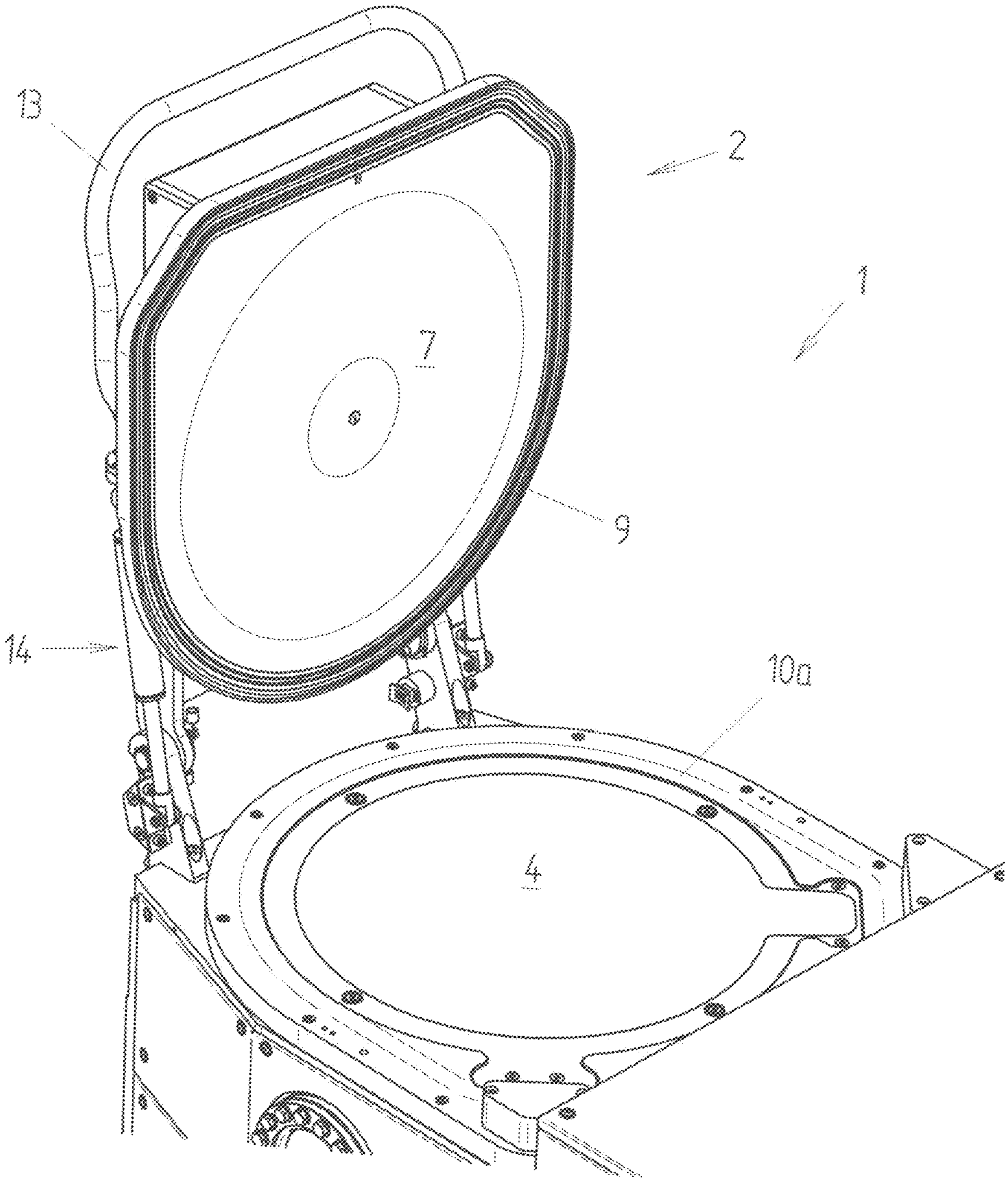
FIG. 1 shows a perspective partial view of a coating module in the opened state in accordance with a preferred embodiment of the present invention.

FIG. 1 shows a perspective view of a coating module 1 for a coating system in accordance with a preferred embodiment of the present invention. In FIG. 1, the lower part of the coating module 1, which forms the evacuatable process chamber, is visible only partially, and the coating module 1 is illustrated in the opened state, i.e., with the chamber lid 2 swung open. The chamber lid 2 of the coating module 1 may be swung open and closed manually by means of the handle 13 and, if necessary, the support of a gas spring 14. In the closed state, the sealing ring 9 of the chamber lid 2 seals off the process chamber in a vacuum-tight manner in engagement with the opposite sealing surface 10*a* of a chamber flange 10 that is connected to the coating module 1. This closed state is shown in a sectional view in FIG. 5.

Figure 5:
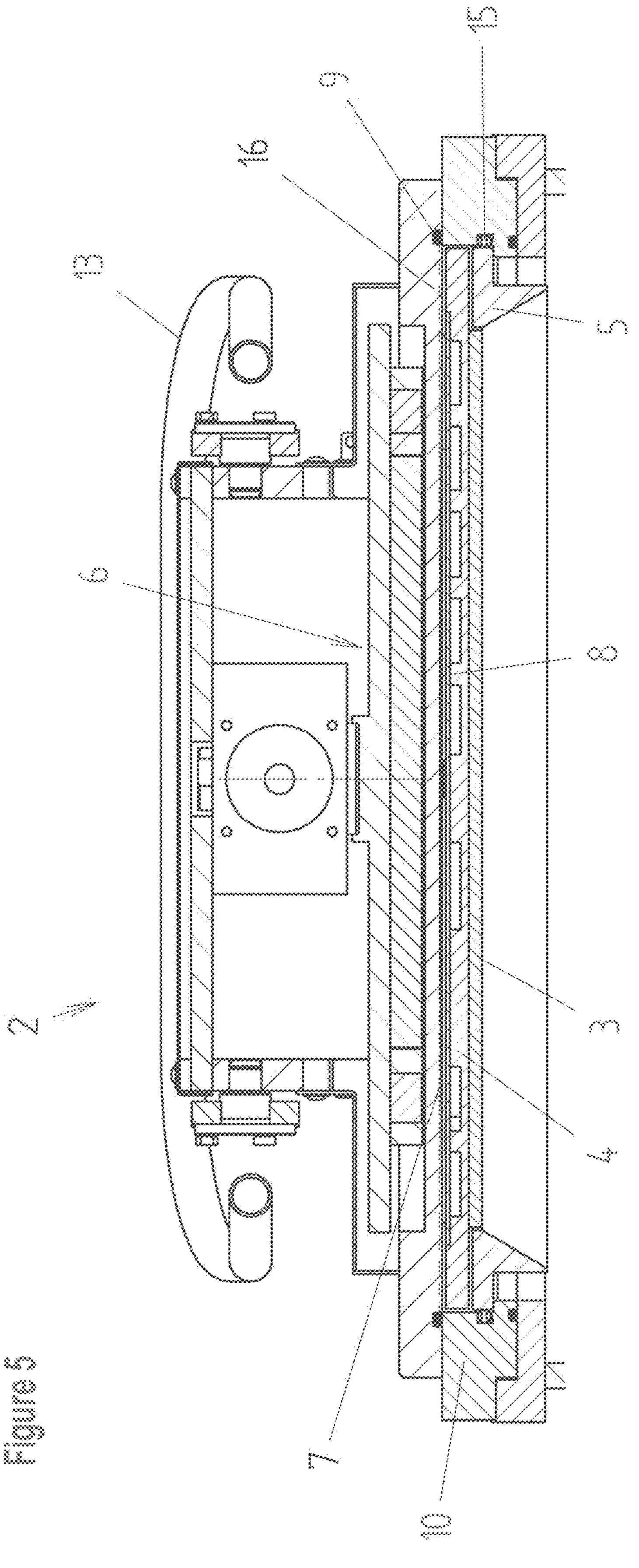
FIG. 5 shows a sectional view through the upper section of the closed coating module in accordance with FIG. 1.

As can be clearly seen in FIG. 5, the coating module 1 comprises a coating unit consisting of a coating target 3, a target backplate 4, a dark space shield 5 and a magnet system 6, wherein the coating target 3, the target backplate 4 and the dark space shield 5 are mounted in the process chamber, namely on components of the coating module 1 that are not assigned to the chamber lid 2. In contrast, the magnet system 6 is mounted on the chamber lid 2 in such a way that lifting the chamber lid 2 from the process chamber separates the magnet system 6 from the rest of the coating unit (see FIG. 1). In this context, the coating target 3 and the target backplate 4 form a cathode, whereas the dark space shield 5, which is screwed to it in an insulated manner, forms part of the anode. As already explained above, the coating target 3, the target backplate 4 and the dark space shield 5 can form a pre-assembled group, which can be mounted in the process chamber and removed from it as a unit. The spring members 15 shown in FIG. 5 serve to center said group in relation to the process chamber.

When the coating module is closed, the so-called dark space is formed between the target backplate 4 and the inner side 7 of the chamber lid 2, which is marked as a thick black line 8 in FIG. 5 and which should define a dark space distance that is as uniform as possible for ideal process conditions. In the present invention, this is preferably put into effect by the inner side 7 of the chamber lid 2 having a concave curvature. In FIG. 1, a corresponding spherical curvature is indicated by the two circles on the inner side 7 of the chamber lid 2. This spherical curvature means that the dark space distance along the cross-section in FIG. 5 is initially not constant but rather increases towards the center. If the process chamber is evacuated, the inner side 7 of the chamber lid 2 is deformed by the pressure difference between the atmosphere and the process chamber. Preferably, the concave curvature is designed in relation to the thickness of the chamber lid 2 and the vacuum provided during operation in such a way that the inner side 7 of the chamber lid 2 is flat under vacuum, thus ensuring a uniform dark space clearance in the dark space 8. The required concave curvature can be determined in advance, e.g., by means of simulations.

As can also be clearly seen from FIGS. 1 and 5, the chamber lid 2 and the magnet system 6 form a flat separation plane 16 which can engage in a vacuum-tight manner with a corresponding flat separation plane of the process chamber.

Figure 2:
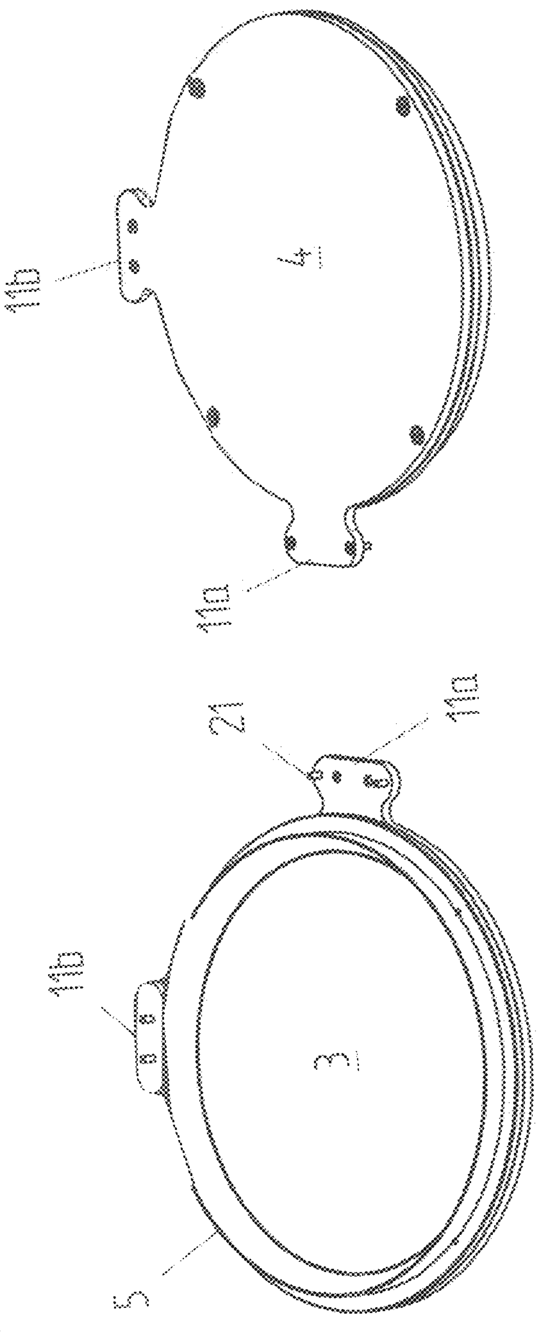
FIG. 2 shows a perspective view from below (left) and from above (right) of the unit consisting of the coating target, target backplate and dark space shield of the coating module in accordance with FIG. 1.

FIG. 2 shows the pre-assembled group of coating target 3, target backplate 4 and dark space shield 5 in a view from below (left) and from above (right). The view from below shows the underside of the coating target 3 and the view from above shows the upper side of the target backplate 4. The coating target 3 is surrounded annularly by the dark space shield 5. The unit shown in FIG. 2 can be easily mounted in and removed from the process chamber using four screws 21.

Preferably, the target backplate 4 comprises one or more protrusions 11*a*, 11*b*, wherein connections for the fluid and/or energy can be provided on the protrusions. In the illustrated preferred exemplary embodiment, a first protrusion 11*a* comprises a water connection for cooling water, and a second protrusion 11*b* comprises a connection for a voltage source.

Figure 3:
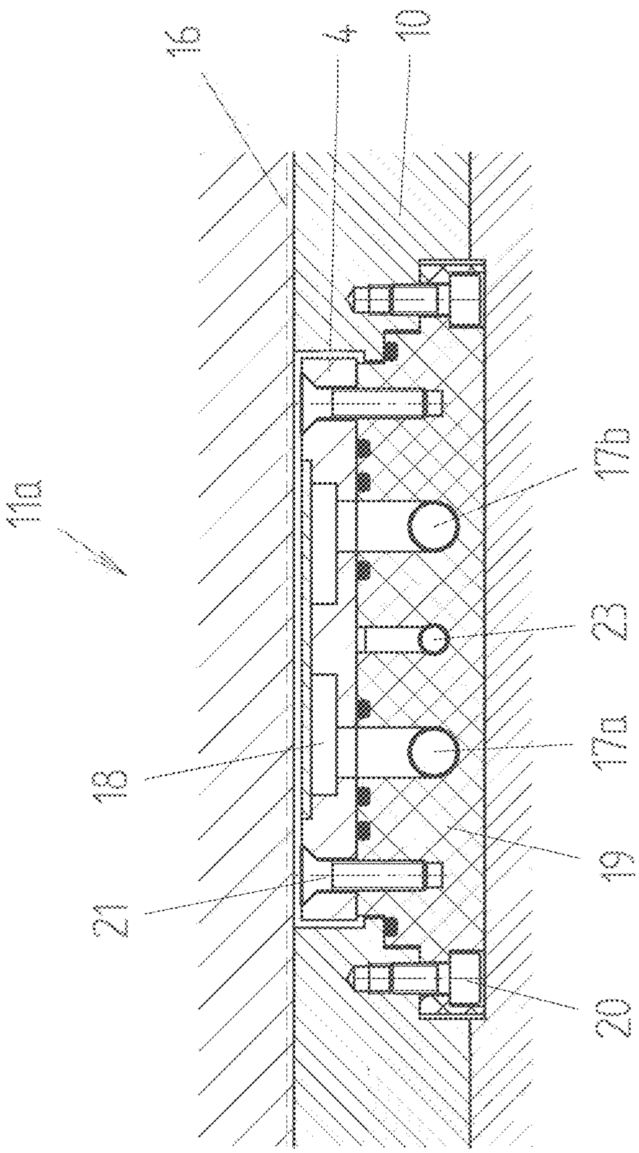
FIG. 3 shows a sectional view through the media connection for the cooling medium of the coating module in accordance with FIG. 1.

FIG. 3 shows a sectional view through the media connection for the cooling water, in which two water connections 17*a* and 17*b* are illustrated, which act as inlet resp. outlet for the cooling water flowing through a corresponding cooling channel 18 in order to cool the target backplate 4 over as large an area as possible. As can also be seen in FIG. 3, the target backplate 4 and chamber flange 10 are screwed together using screws 20, which extend through an insulator 19. Further screws 21 are used to mount the target backplate 4 to said insulator 19, allowing the chamber flange 10 and target backplate 4 to be at different potentials. FIG. 3 also shows a series of sealing rings (without reference signs), which are intended to ensure a correspondingly tight connection.

Figure 4:
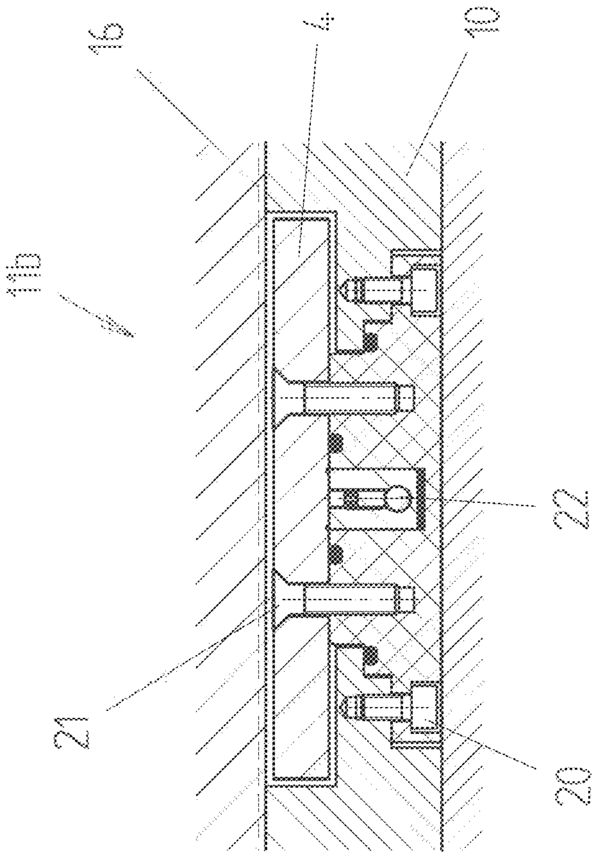
FIG. 4 shows a sectional view through the media connection for the output of the coating module in accordance with FIG. 1.

The corresponding media connection for the voltage is shown in a sectional view in FIG. 4. The individual components and their connection via screws 20 and 21 are similar to those discussed in relation to FIG. 3. However, instead of the water connections 17*a* and 17*b*, a connection 22 for a voltage source is provided here in order to define the potential of the target backplate 4.

As can be taken from FIGS. 3 and 4, both the cooling medium connection and the power connection can be implemented by means of an insulator. During cathode replacement, the insulator and the media seals remain in the process chamber. The insulator ensures a defined potential separation between the process chamber and the target backplate. It also ensures the dark space clearance in the area of the media connections through appropriate tolerancing. To further improve the vacuum seal, a sealing volume 23 (see FIG. 3) can be implemented in the insulator 19 for intermediate suction. This reduces the pressure difference between the process chamber and the sealing point, which leads to vacuum improvement due to lower permeation in the sealing area.

The invention claimed is:

1. A coating module for a coating system, wherein the coating module comprises a process chamber which can be evacuated, a chamber lid for closing the process chamber in a vacuum-tight manner, and a coating unit consisting of a coating target, a target backplate, a dark space shield, and a magnet system, wherein the coating target, the target backplate and the dark space shield are mounted in the process chamber, wherein the magnet system is mounted on the chamber lid and wherein a media supply is provided for providing the coating unit with a fluid and/or energy on the target backplate, wherein an inner side of the chamber lid comprises a concave curvature, wherein the concave curvature is designed in relation to a thickness of the chamber lid and a vacuum provided during operation in such a way that the inner side of the chamber lid is configured in a flat manner under vacuum.

2. The coating module according to claim 1, wherein the coating target, the target backplate and the dark space shield are not connected to the chamber lid so that lifting the chamber lid from the process chamber separates the magnet system from the rest of the coating unit.

3. The coating module according to claim 1, wherein the media supply is not connected to the chamber lid so that the media supply remains static while the chamber lid is lifted from the process chamber.

4. The coating module according to claim 1, wherein the coating target, the target backplate and the dark space shield form a pre-assembled group which can be mounted in the process chamber and removed from it as a unit.

5. The coating module according to claim 4, further comprising a spring member configured for positioning the pre-assembled group of the coating target, the target backplate and the dark space shield in a defined manner in the process chamber and configured for contacting the pre-assembled group.

6. The coating module according to claim 4, wherein the dark space shield is connected to the coating target and/or the target backplate in an insulated manner.

7. The coating module according to claim 1, wherein the chamber lid and the magnet system form a flat separation plane which can engage with a corresponding flat separation plane of the process chamber in a vacuum-tight manner.

8. The coating module according to claim 1, wherein the concave curvature may comprise a section circular-cylindrical or spherical in shape.

9. The coating module according to claim 1, wherein the target backplate comprises one or more protrusions, wherein connections for the fluid and/or energy are provided on the protrusions.

10. The coating module according to claim 1, wherein the chamber lid can be swung open manually.

11. A coating system with a coating module according to claim 1 and several additional modules, wherein the coating and additional modules are arranged substantially annularly defining an annulus with an inner side and wherein the chamber lid of the coating module can be swung open in the direction of the inner side of the annulus.

12. A method for replacing a coating target in the coating module of claim 1, wherein the method comprises:

a. venting the coating module;
b. opening the chamber lid;
c. removing the coating target, target backplate and dark space shield;
d. mounting a new coating target, a new target backplate and a new dark space shield;
e. closing the chamber lid; and
f. pumping down the coating module.

13. The method according to claim 12, wherein the coating target, target backplate and dark space shield form a pre-assembled group which can be mounted in the process chamber and removed from it as a unit, and wherein step c. comprises the removal of the pre-assembled unit.

14. The method according to claim 12, wherein step d. comprises:

mounting a pre-assembled group of the new coating target, the new target backplate and the new dark space shield.

15. The method according to claim 12, wherein, depending on a strength of a material used, the thickness of the chamber lid is designed in such a way that the inner side of the chamber lid forms a flat surface after the coating module has been pumped down.

16. The method according to claim 12, wherein the new coating target is mounted in the process chamber free of vacuum forces after the coating module has been pumped down.

17. The method according to claim 12, wherein the new coating target and the new target backplate are located in a vacuum all around after the coating module has been pumped down, with the exception of local connection points.

18. A coating module for a coating system, wherein the coating module comprises a process chamber which can be evacuated, a chamber lid for closing the process chamber in a vacuum-tight manner, and a coating unit consisting of a coating target, a target backplate, a dark space shield, and a magnet system, wherein the coating target, the target backplate and the dark space shield are mounted in the process chamber, wherein the magnet system is mounted on the chamber lid, wherein the coating target, the target backplate and the dark space shield are not connected to the chamber lid so that lifting the chamber lid from the process chamber separates the magnet system from the rest of the coating unit, wherein an inner side of the chamber lid comprises a concave curvature, wherein the concave curvature is designed in relation to a thickness of the chamber lid and a vacuum provided during operation in such a way that the inner side of the chamber lid is configured in a flat manner under vacuum.

19. The coating module according to claim 18, wherein the coating target, the target backplate and the dark space shield form a pre-assembled group which can be mounted in the process chamber and removed from it as a unit.

20. The coating module according to claim 19, further comprising a spring member configured for positioning the pre-assembled group of the coating target, the target backplate and the dark space shield in a defined manner in the process chamber and configured for contacting the pre-assembled group.

21. The coating module according to claim 19, wherein the dark space shield is connected to the coating target and/or the target backplate in an insulated manner.

22. The coating module according to claim 18, wherein the chamber lid and the magnet system form a flat separation plane which can engage with a corresponding flat separation plane of the process chamber in a vacuum-tight manner.

23. The coating module according to claim 18, wherein the concave curvature may comprise a section circular-cylindrical or spherical in shape.

24. The coating module according to claim 18, wherein the target backplate comprises one or more protrusions, wherein connections for a fluid and/or energy are provided on the one or more protrusions.

25. The coating module according to claim 18, wherein the chamber lid can be swung open manually.

* * * * *